United States Patent [19]
Havel

[11] Patent Number: 5,194,854
[45] Date of Patent: Mar. 16, 1993

[54] MULTICOLOR LOGIC DEVICE

[76] Inventor: Karel Havel, 15 Kensington Road, Apt. #704, Bramalea, Ontario, Canada, L6T 3W2

[21] Appl. No.: 579,858

[22] Filed: Sep. 10, 1990

Related U.S. Application Data

[60] Continuation-in-part of Ser. No. 197,322, May 13, 1988, abandoned, which is a division of Ser. No. 819,111, Jan. 15, 1986, Pat. No. 4,794,383.

[30] Foreign Application Priority Data

Jan. 15, 1987 [CA] Canada ............................ 527374
May 20, 1988 [CA] Canada ............................ 567323

[51] Int. Cl.$^5$ .............................................. G09G 3/14
[52] U.S. Cl. ............................... 340/815.1; 340/762
[58] Field of Search ........... 340/815.1, 815.03, 815.31, 340/701, 703, 704, 762, 782, 803; 307/440, 445, 460, 311; 313/498, 501, 502; 358/13; 379/3, 900

[56] References Cited

U.S. PATENT DOCUMENTS

| | | | |
|---|---|---|---|
| 3,522,445 | 8/1970 | Foerster | 307/235 |
| 3,840,873 | 10/1974 | Usui | 340/762 |
| 3,873,979 | 3/1975 | Craford et al. | 340/815.03 |
| 3,875,456 | 4/1975 | Kano et al. | 313/501 |
| 3,924,227 | 12/1975 | Stolov | 340/703 |
| 4,086,514 | 4/1978 | Havel | 340/703 |
| 4,388,589 | 6/1983 | Molldrem, Jr. | 340/815.03 |
| 4,396,937 | 8/1983 | Reitmeier et al. | 358/13 |
| 4,420,711 | 12/1983 | Takahashi et al. | 340/782 |
| 4,488,149 | 12/1984 | Givens, Jr. | 340/762 |

OTHER PUBLICATIONS

Wagner, "2 color LED+Driver=versatile visual effects", EDN, vol. 25, No. 19, Oct. 20, 1980, p. 164.
Ralph Snyder, "-color LED×3 Bits=8 visual effects", EDN, vol. 26, No. 14, Jul. 22, 1981, pp. 382-383.
Kraus, "Two-LED's blend and blink to indicate six states", Electronic Design, vol. 30, No. 16, Aug. 5, 1982, p. 220.

Primary Examiner—Donald J. Yusko
Assistant Examiner—Edwin C. Holloway, III

[57] ABSTRACT

A logic device simultaneously indicates on a single multicolor optical output a first logical function and a second diverse logical function of its inputs. The multicolor optical output of the logic device is illuminated in accordance with the first logical function of the inputs. The color of the multicolor optical output is controlled in accordance with the second logical function of the inputs.

14 Claims, 3 Drawing Sheets

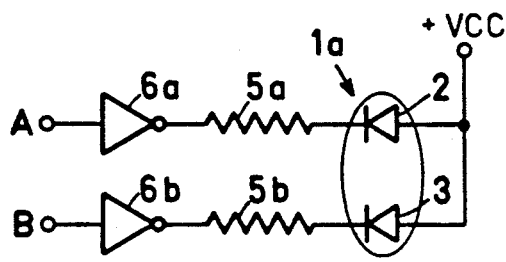
FIG. 1
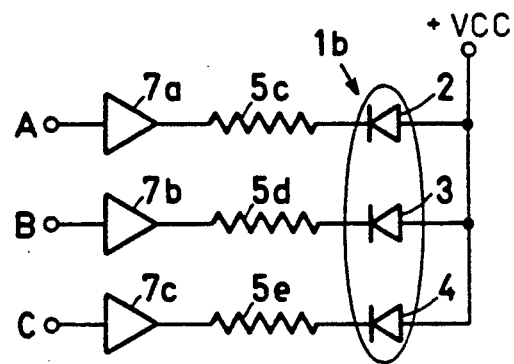
FIG. 4
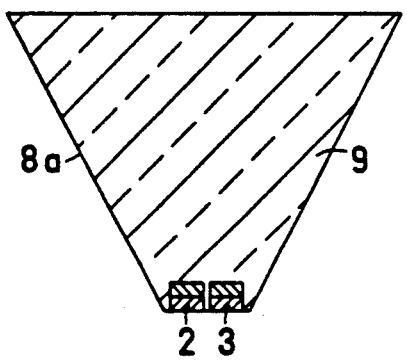
FIG. 2
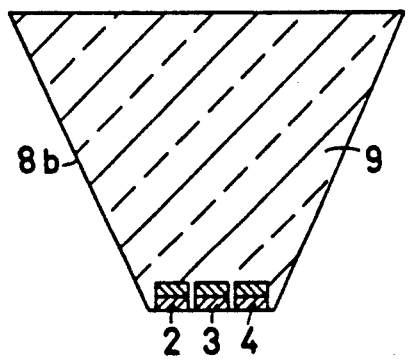
FIG. 5
| INPUT A B | LIGHT | COLOR |
|---|---|---|
| 0 0 | NO | - |
| 0 1 | YES | GREEN |
| 1 0 | YES | RED |
| 1 1 | YES | YELLOW |
FIG. 3
| INPUT A B C | LIGHT | COLOR |
|---|---|---|
| 1 1 1 | NO | - |
| 0 1 1 | YES | RED |
| 1 0 1 | YES | GREEN |
| 1 1 0 | YES | BLUE |
| 0 0 1 | YES | YELLOW |
| 1 0 0 | YES | BLUE-GREEN |
| 0 1 0 | YES | PURPLE |
| 0 0 0 | YES | WHITE |
FIG. 6

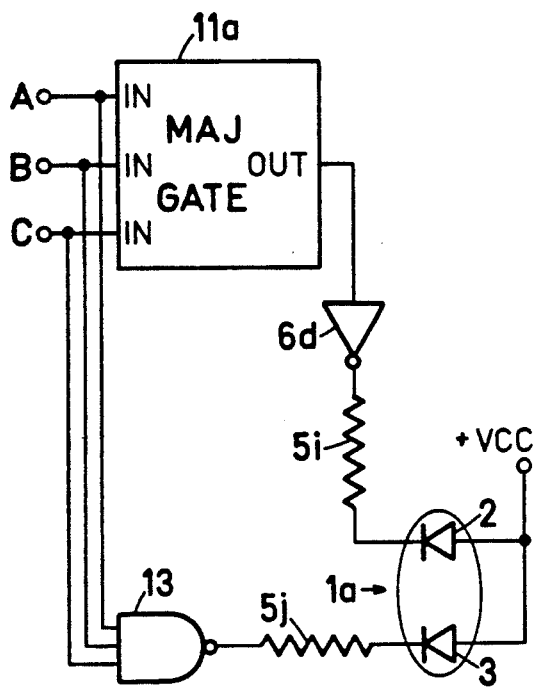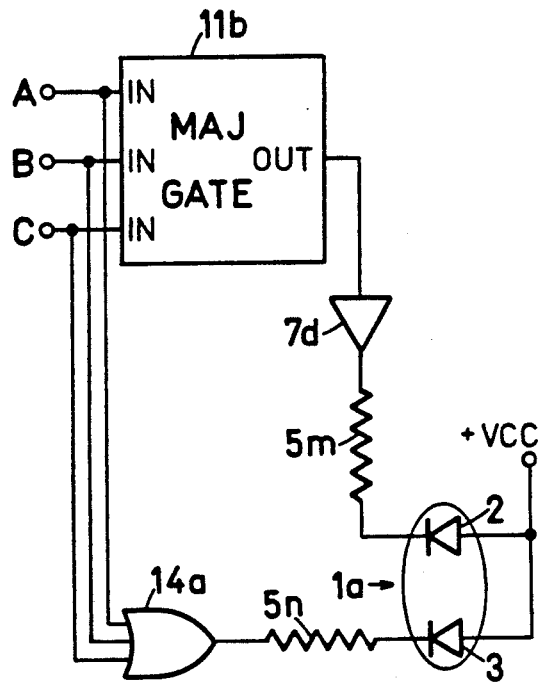
FIG. 7
FIG. 9
| INPUT<br>A B C | LIGHT | COLOR |
|---|---|---|
| 0 0 0 | NO | - |
| 0 0 1 | NO | - |
| 0 1 0 | NO | - |
| 1 0 0 | NO | - |
| 0 1 1 | YES | RED |
| 1 1 0 | YES | RED |
| 1 0 1 | YES | RED |
| 1 1 1 | YES | YELLOW |
FIG. 8
| INPUT<br>A B C | LIGHT | COLOR |
|---|---|---|
| 0 0 0 | YES | YELLOW |
| 0 0 1 | YES | RED |
| 0 1 0 | YES | RED |
| 1 0 0 | YES | RED |
| 0 1 1 | NO | - |
| 1 1 0 | NO | - |
| 1 0 1 | NO | - |
| 1 1 1 | NO | - |
FIG. 10

| INPUT<br>A B C | LIGHT | COLOR |
|---|---|---|
| 0 0 0 | NO | - |
| 0 0 1 | YES | BLUE |
| 0 1 0 | YES | BLUE |
| 1 0 0 | YES | BLUE |
| 0 1 1 | YES | GREEN |
| 1 1 0 | YES | GREEN |
| 1 0 1 | YES | GREEN |
| 1 1 1 | YES | RED |

5,194,854

MULTICOLOR LOGIC DEVICE

CROSS-REFERENCE TO RELATED APPLICATIONS

This is a continuation-in-part of my application Ser. No. 07/197,322, filed on May 23, 1988, now abandoned, entitled Variable Color Digital Multimeter, which is a division of my application Ser. No. 06/819,111, filed on Jan. 15, 1986, entitled Variable Color Digital Multimeter, now U.S. Pat. No. 4,794,383 issued on Dec. 27, 1988.

This also relates to my application Ser. No. 06/936,236, filed on Apr. 3, 1987, entitled Multicolor Logic Device, now abandoned, and to my application Ser. No. 07/191,191, filed on May 6, 1988, entitled Multicolor Logic Device, now abandoned.

BACKGROUND OF THE INVENTION

1. Field of the Invention

This invention relates to multicolor optical circuits for performing logical operations.

2. Description of the Prior Art

Logic circuits are designed to perform predetermined logical operations usually governed by the principles of Boolean algebra. Logic gates for performing Boolean logical operations AND, OR, NAND, NOR and NOT are commercially available and extensively used. Also well known are logic gates for performing diverse logical operations based on a majority or a minority concept.

It will be recalled that an OR gate provides an output low level signal when all its inputs are at a low level and an output high level signal when at least one of its inputs is at a high level. The output, however, is not capable of indicating which ones, or how many, of its inputs are at a high level.

In a similar fashion, an AND gate provides an output high level signal when all its inputs are at a high level and an output low level signal when at least one of its inputs is at a low level, without indicating which ones, or how many, of its inputs are at a low level.

A commercially known majority gate provides an output high level signal when a majority of its inputs is at a high level, without indicating whether only some or all of its inputs are at a high level, and an output low signal when a majority of its inputs is at a low level.

It is well understood that a NOR function is obtained by inverting an OR function, a NAND function is obtained by inverting an AND function, and a minority function is obtained by inverting a majority function.

A multicolor semiconductor lamp comprising a plurality of light emitting diodes for emitting light of respectively different colors is disclosed in U.S. Pat. No. 3,875,456 issued on Apr. 1, 1975 to Tsuyoshi Kano et al. The light emitting diodes are closely adjacent and covered by a layer of light scattering material to provide an appearance of a single light source.

A majority logic gate, disclosed in U.S. Pat. No. 3,522,445 issued on Aug. 4, 1970 to Roy P. Foerster, utilizes precision resistors forming an input summation network and a differential amplifier for comparing the summation result with a threshold level.

A multicolor indicator, described in the article by William G. Ralphsnyder, entitled 2-color LED×3 bits=8 visual effects, published in EDN, Jul. 22, 1981, Volume 26, No. 14, pages 382 to 383, utilizes back-to-back connected red and green LEDs driven by a timer for providing eight visual effects. Since the LEDs are connected to conduct currents in opposite directions, it would be impossible to forwardly bias them simultaneously. The concept of back-to-back connected multicolor LEDs cannot be used in a three primary color multicolor device.

SUMMARY OF THE INVENTION

Accordingly, it is the principal object of this invention to provide an improved logic device.

It is another object of the invention to provide a logic device having a multicolor optical output.

It is further object of the invention to provide a logic device having an optical output which is capable of simultaneously indicating a predetermined logical function of its inputs and the conditions of respective inputs.

It is still further object of the invention to provide a logic device capable of simultaneously indicating on a single output two diverse logical functions of its inputs.

It is still further object of the invention to provide a logic device having an optical output which is capable of illuminating in accordance with a first logical function of its inputs in a color in accordance with a second diverse logical function of its inputs.

It is still further object of the invention to provide a combined majority/AND logic device.

It is still further object of the invention to provide a combined minority/OR logic device.

It is still further object of the invention to provide a combined OR/majority/AND logic device.

In summary, a multicolor logic device of the invention includes a plurality of inputs for receiving input logical signals, a first logic device coupled to the inputs for performing a first logical operation of the inputs, and a multicolor light source coupled to the output of the first logic device for illuminating accordingly. A second logic device is also coupled to the inputs for performing a second diverse logical operation of the inputs and for controlling the color of the multicolor light source accordingly.

BRIEF DESCRIPTION OF THE DRAWINGS

In the drawings in which are shown the preferred embodiments of the invention,

FIG. 1 is a schematic diagram of a multicolor logic OR gate of the present invention.

FIG. 2 is an enlarged cross-sectional view revealing internal structure of the multicolor LED in FIG. 1.

FIG. 3 is a chart showing the relationship between input signal conditions and output color in the OR gate in FIG. 1.

FIG. 4 is a schematic diagram of a multicolor logic NAND gate of the present invention.

FIG. 5 is an enlarged cross-sectional view revealing internal structure of the multicolor LED in FIG. 4.

FIG. 6 is a chart showing the relationship between input signal conditions and output color in the NAND gate in FIG. 4.

FIG. 7 is a schematic diagram of a combined multicolor majority/AND gate of the present invention.

FIG. 8 is a chart showing the relationship between input signal conditions and output color in the combined majority/AND gate in FIG. 7.

FIG. 9 is a schematic diagram of a combined multicolor minority/OR gate of the present invention.

FIG. 10 is a chart showing the relationship between input signal conditions and output color in the combined minority/OR gate in FIG. 9.

Throughout the drawings, like characters indicate like parts.

DESCRIPTION OF THE PREFERRED EMBODIMENTS

Figures 11, 12:
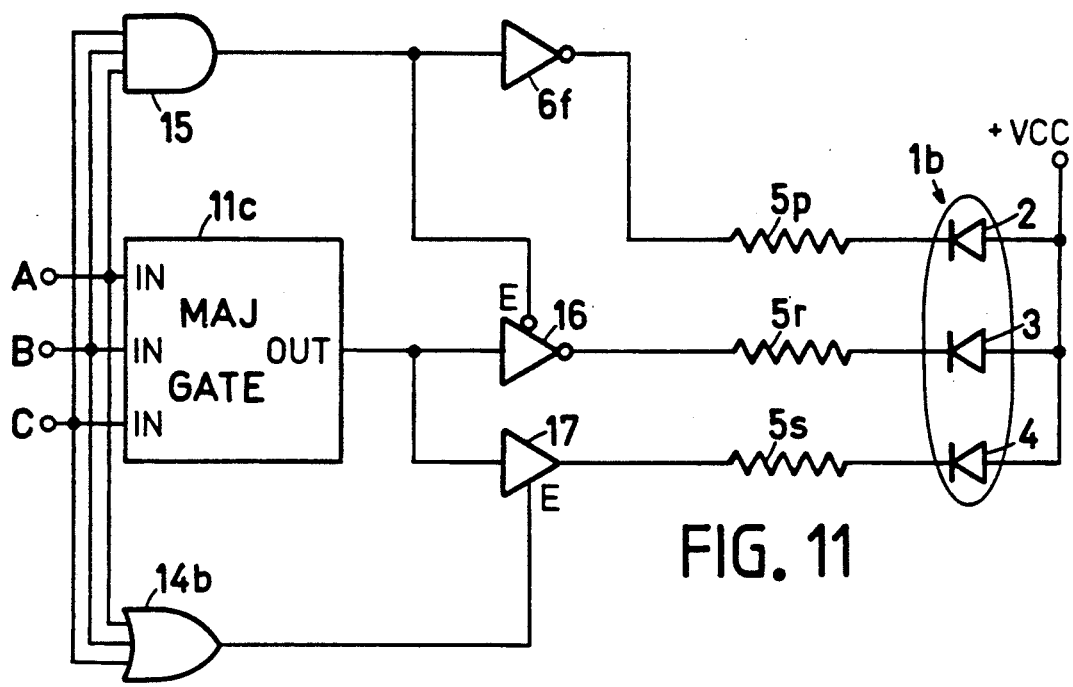
FIG. 11 is a schematic diagram of a combined multicolor OR/majority/AND gate of the present invention.
FIG. 12 is a chart showing the relationship between input signal conditions and output color in the combined OR/majority/AND gate in FIG. 11.

Referring now, more particularly, to the drawings, in FIG. 1 is shown a schematic diagram of a device for performing an OR logical operation. Two voltage levels, referred to as a low logic level (designated as 0) and a high logic level (designated as 1), are used in the description of the circuit. The device has two inputs A, B for receiving binary signals and a multicolor LED 1a for visually indicating logical function of the inputs. The multicolor LED includes a red LED 2 and green LED 3 which are closely adjacent such that the light signals emitted therefrom are substantially superimposed upon one another to mix the colors.

In FIG. 2, red LED 2 and green LED 3 are placed on the base of a housing 8a which is filled with a transparent light scattering material 9. When forwardly biased, the LEDs 2 and 3 emit light signals of red and green colors, respectively, which are scattered within transparent material 9, thereby blending the red and green light signals into a composite light signal that emerges at the upper surface of housing 8a. The color of the composite light signal may be controlled by varying portions of the red and green light signals.

Returning again to FIG. 1, the operation of the circuit will be explained by also referring to its associated chart in FIG. 3. When both inputs A and B are low, outputs of inverting buffers 6a and 6b rise to a high logic level. No current flows in either LED branch, and both LEDs remain extinguished. When input B is raised to a high logic level, while input A is low, the output of buffer 6b drops to a low logic level. The current flows from a voltage source +VCC, via green LED 3 and resistor 5b, to the current sinking output of buffer 6b. As a result, green LED 3 illuminates. When input A is raised to a high logic level, while input B is low, the output of buffer 6a drops to a low logic level. The current flows from +VCC, via red LED 2 and resistor 5a, to the output of buffer 6a. As a result, red LED 2 illuminates. When both inputs A, B are raised to a high logic level, the outputs of buffers 6a, 6b drop to a low logic level. The current flows from +VCC, via red LED 2 and resistor 5a, to the output of buffer 6a. The current also flows from +VCC, via green LED 3 and resistor 5b, to the output of buffer 6b. As a result of blending light signals of red and green colors, a composite light signal of substantially yellow color is produced.

When the presence of light is associated with a high logic level and absence of light with a low logic level, the circuit in FIG. 1 is an equivalent of a Boolean OR gate. As viewed in FIG. 3, the circuit is additionally capable of indicating by different colors the conditions of signals at its respective inputs. When a single input is raised to a high logic level, multicolor LED 1a illuminates in a pure color: red for input A or green for input B. When both inputs are raised to a high logic level, multicolor LED 1a illuminates in a composite color: yellow.

In a device for performing a logical NAND operation shown in FIG. 4, a multicolor LED 1b includes a red LED 2, green LED 3, and blue LED 4 which are closely adjacent such that the light signals emitted therefrom are substantially superimposed upon one another to mix the colors.

In FIG. 5, red LED 2, green LED 3, and blue LED 4 are placed on the base of a housing 8b which is filled with a transparent light scattering material 9. Red LEDs are typically manufactured by diffusing a p-n junction into a GaAsP epitaxial layer on a GaAs substrate; green LEDs typically use a GaP epitaxial layer on a GaP substrate; blue LEDs are typically made from SiC material.

When forwardly biased, the LEDs 2, 3, and 4 emit light signals of red, green, and blue colors, respectively, which are scattered within transparent material 9, thereby blending the red, green, and blue light signals into a composite light signal that emerges at the upper surface of housing 8b. The color of the composite light signal may be controlled by varying portions of the red, green, and blue light signals.

Returning again to FIG. 4, the operation of the circuit will be explained by also referring to its associated chart in FIG. 6. When all three inputs A, B, C are high, outputs of non-inverting buffers 7a, 7b, 7c rise to a high logic level. No current flows in either LED branch, and all three LEDs remain extinguished. When the input A is forced to a low logic level, while inputs B, C are high, the output of buffer 7a drops to a low logic level. The current flows from +VCC, via red LED 2 and resistor 5c, to the current sinking output of buffer 7a. As a result, red LED 2 illuminates. When the input B is forced to a low logic level, while inputs A, C are high, the output of buffer 7b drops to a low logic level. The current flows from +VCC, via green LED 3 and resistor 5d, to the output of buffer 7b. As a result, green LED 3 illuminates. When the input C is forced to a low logic level, while inputs A, B are high, the output of buffer 7c drops to a low logic level. The current flows from +VCC, via blue LED 4 and resistor 5e, to the output of buffer 7c. As a result, blue LED 4 illuminates. When both inputs A, B are forced to a low logic level, while input C is high, the outputs of buffers 7a, 7b drop to a low logic level. The current flows from +VCC, via red LED 2 and resistor 5c, to the output of buffer 7a. The current also flows from +VCC, via green LED 3 and resistor 5d, to the output of buffer 7b. As a result of blending light signals of red and green colors, a composite light signal of substantially yellow color is produced. When inputs B, C are forced to a low logic level, while input A is high, the outputs of buffers 7b, 7c drop to a low logic level. The current flows from +VCC, via green LED 3 and resistor 5d, to the output of buffer 7b. The current also flows from +VCC, via blue LED 4 and resistor 5e, to the output of buffer 7c. colors, a composite light signal of substantially blue-green color is produced. When inputs A, C are forced to a low logic level, while input B is high, the outputs of buffers 7a, 7c drop to a low logic level. The current flows from +VCC, via red LED 2 and resistor 5c, to the output of buffer 7a. The current also flows from +VCC, via blue LED 4 and resistor 5e, to the output of buffer 7c. As a result of blending light signals of red and blue colors, a composite light signal of substantially purple color is produced. When all inputs A, B, C are forced to a low logic level, the outputs of buffers 7a, 7b, 7c drop to a low logic level. The current flows from +VCC, via red LED 2 and resistor 5c, to the output of buffer 7a. The current also flows from +VCC, via green LED 3 and resistor 5d, to the output of buffer 7b. The current also flows from +VCC, via blue LED 4 and resistor 5e, to the output of buffer 7c. As a result of blending light signals of red, green, and blue colors, a composite light signal of substantially white color is produced.

When the presence of light is associated with a high logic level and absence of light with a low logic level, the circuit in FIG. 4 is an equivalent of a Boolean NAND gate. As viewed in FIG. 6, the circuit is additionally capable of indicating by different colors the conditions of signals at its respective inputs. When a single input is forced to a low logic level, multicolor LED 1b illuminates in a pure color: red for input A, green for input B, or blue for input C. When two inputs are forced to a low logic level, multicolor LED 1b illuminates in a composite color: yellow for inputs A and B, blue-green for inputs B and C, or purple for inputs A and C. When all three inputs are forced to a low logic level, multicolor LED 1b illuminates in white color.

By referring to FIG. 7, the operation of the combined majority/AND gate will be explained by also considering its associated chart in FIG. 8. When all three inputs A, B, C, respectively coupled to the inputs IN of a majority gate 11a, are low, the output OUT of majority gate 11a is also low, thereby forcing the output of inverting buffer 6d to rise to a high logic level. The red LED 2 extinguishes, because no current flows in its branch. The output of NAND gate 13 is high, thereby causing green LED 3 to extinguish, because no current flows in its branch.

When a single input A, B, or C is raised to a high logic level, while the remaining inputs are low, the output OUT of majority gate 11a remains low, and red LED 2 remains extinguished.

When any two of the inputs A, B, C are raised to a high logic level, while the remaining input is low, the output gate 11a rises to a high logic level, in OUT of majority gate 11a rises to a high logic level, in accordance with a majority function of its inputs, thereby causing the output of inverting buffer 6d to drop to a low logic level. The current flows in red LED 2 branch from +VCC, via red LED 2 and resistor 5i, to the current sinking output of inverting buffer 6d, causing red LED 2 to illuminate.

When all three inputs A, B, C are raised to a high logic level, the output OUT of majority gate 11a remains high, causing red LED 2 to remain illuminated. Additionally, the output of NAND gate 13 drops to a low level. The current flows in the green red LED 3 branch from +VCC, via green LED 3 and resistor 5j, to the output of NAND gate 13, causing green LED 3 to illuminate. As a result of blending light signals of red and green colors, multicolor LED 1a illuminates in substantially yellow color.

It will be appreciated that NAND gate 13 is used in the circuit in FIG. 7 to perform an AND logical operations of the inputs A, B, C, for the sake of simplicity, in lieu of a combination of an AND gate plus an inverting buffer (not shown), which would be otherwise necessary to forwardly bias green LED 3.

In summary, when two of the inputs A, B, C of the majority/AND logic circuit in FIG. 7 are raised to a high logic level, multicolor LED 1a illuminates in red color, in accordance with a majority logical function of its inputs. When all three inputs A, B, C of the circuit are raised to a high logic level, multicolor LED 1a illuminates in yellow color, in accordance with an AND logical function of its inputs. Thus the circuit performs a combined majority and AND logical function.

The operation of the combined minority/OR gate viewed in FIG. 9 will be explained by also making reference to its associated chart in FIG. 10. It will be appreciated that the minority function is obtained by effectively inverting the majority function of the circuit in FIG. 7, by using a non-inverting buffer 7d in lieu of inverting buffer 6d in FIG. 7.

When all three inputs A, B, C, respectively coupled to the inputs IN of majority gate 11b, are low, the output OUT of majority gate 11b is also low, thereby forcing the output of non-inverting buffer 7d to drop to a low logic level. The current flows in the red LED 2 branch from +VCC, via red LED 2 and resistor 5m, to the current sinking output of non-inverting buffer 7d, causing red LED 2 to illuminate. The output of OR gate 14a drops to a low level in accordance with an OR logical function of the inputs A, B, C. As a consequence, the current flows in the green red LED 3 branch from +VCC, via green LED 3 and resistor 5n, to the output of OR gate 14a, causing green LED 3 to illuminate. As a result of blending light signals of red and green colors, multicolor LED 1a illuminates in substantially yellow color.

When a single input A, B, or C is raised to a high logic level, while the remaining inputs are low, the output OUT of majority gate 11b remains low, and red LED 2 remains illuminated. However, the output of OR gate 14 rises to a high logic level, thereby causing green LED 3 to extinguish, because no current flows in its branch.

When any two of the inputs A, B, C are raised to a high logic level, while the remaining input is low, the output OUT of majority gate 11b rises to a high logic level, in accordance with the majority logical function of the inputs A, B, C, thereby causing the output of non-inverting buffer 7d to rise to a high logic level. The red LED 2 extinguishes, because no current flows in its branch. Similarly, green LED 3 remains extinguished, because no current flows in its branch.

When all three inputs A, B, C are raised to a high logic level, the output OUT of majority gate 11b remains high, causing red LED 2 to remain extinguished. Similarly, the output of OR gate 14a remains high, causing green LED 3 to remain extinguished.

In summary, when only a single input A, B, or C of the minority/OR logic circuit in FIG. 9 is raised to a high logic level, multicolor LED 1a illuminates in red color, in accordance with a minority logical function of its inputs. When all three inputs A, B, C of the circuit are forced to a low logic level, multicolor LED 1a illuminates in yellow color, in accordance with an OR logical function of its inputs. Thus the circuit performs a combined minority and OR logical function.

The operation of the combined OR/majority/AND gate presented in FIG. 11 will be explained by also considering its accompanying chart viewed in FIG. 12. When all three inputs A, B, C, respectively coupled to the inputs of OR gate 14b, are low, the output of OR gate 14b, coupled to the enable input E of tri-state non-inverting buffer 17, drops to a low logic level to disable tri-state non-inverting buffer 17, effectively causing its output to be disconnected. As a result, blue LED 4 coupled to the output of tri-state non-inverting buffer extinguishes. The red LED 2 and green LED 3 are also extinguished, because no current flows in their branches.

When a single input A, B, or C is raised to a high logic level, while the remaining inputs are low, the output of OR gate 14b rises to a high logic level to enable tri-state non-inverting buffer 17. The output OUT of majority gate 11c is at a low logic level, thereby forcing the output of tri-state non-inverting buffer 17 to a low logic level. The current flows in the blue LED 4 branch from +VCC via blue LED 4 and resistor 5s to the current sinking output of tri-state non-inverting buffer 17, causing blue LED 4 to illuminate. The red LED 2 and green LED 3 remain extinguished.

When any two of the inputs A, B, C are raised to a high logic level, while the remaining input is low, the output OUT of majority gate 11c rises to a high logic level, in accordance with a majority logical function of its inputs, thereby forcing the output of tri-state inverting buffer 16 to drop to a low logic level. Since one of the inputs A, B, C is low, the output of AND gate 15, connected to the enable input E of tri-state inverting buffer 16, is at a low logic level, thereby enabling the latter. The current flows in the green LED 3 branch from +VCC via green LED 3 and resistor 5r to the current sinking output of tri-state inverting buffer 16, causing green LED 3 to illuminate. Since the output of tri-state non-inverting buffer 17 is now at a high logic level, blue LED 4 in its output path extinguishes.

When all three inputs A, B, C are raised to a high logic level, the output of AND gate 15 rises to a high logic level, thereby disabling tri-state inverting buffer 16, effectively causing its output to be disconnected. As a result, green LED 3 extinguishes. At the same time, the output of buffer 6f drops to a low level. The current in the red LED 2 branch flows from +VCC via red LED 2 and resistor 5p to the current sinking output of buffer 6f, causing red LED 2 to illuminate.

In summary, when all three inputs A, B, C of the OR/majority/AND logic circuit in FIG. 11 are forced to a low logic level, multicolor LED 1b extinguishes, in accordance with an OR logical function of the inputs. When a single one of the inputs A, B, C is raised to a high logic level, while the remaining two inputs are low, multicolor LED 1b illuminates in blue color, in accordance with a minority logical function of the inputs. When any two of the inputs A, B, C are raised to a high logic level, while the remaining one input is low, multicolor LED 1b illuminates in green color, in accordance with a majority logical function of the inputs. When all three inputs A, B, C are raised to a high logic level, multicolor LED 1b illuminates in red color, in accordance with an AND logical function of the inputs. Thus the logic circuit performs a combined OR, majority, and AND logical function, allowing to readily and effectively observe whether the input logical signals are progressively rising or falling.

It would be obvious to those skilled in the art, in the view of this disclosure, that multicolor logic devices with more than three inputs may be readily constructed in accordance with the principles of the invention, and that the inputs of such logic devices may either have the same significance or may be weighted. It would be also obvious that the color sequences corresponding to the input logical functions could be readily changed by differently connecting the colored LEDs. It is also contemplated that other combinations of Boolean gates and majority/minority gates are within the scope of the invention.

The device of this invention may be useful in applications where it is desirable to monitor or indicate a progress of changes of input logical signals from all low levels through minority and majority to all high levels, or vice versa.

To convert optical output of the multicolor LED to electrical signals, a phototransistor, or other optical sensor, may be disposed adjacent to the LEDs and oriented to intercept the light signals emitted therefrom (not shown).

In brief summary, the invention describes a method of simultaneously indicating a first logical function and a second diverse logical function of a plurality of inputs, by illuminating a multicolor optical output in accordance with the first logical function of the inputs and by controlling the color of said optical output in accordance with the second logical function of the inputs.

A multicolor logic device was disclosed which includes a plurality of inputs for receiving input signals and a multicolor light source coupled to the inputs for illuminating in accordance with a first logical function of the inputs. Color control is provided for controlling the color of the multicolor light source in accordance with a second diverse logical function of the inputs.

It would be obvious that persons skilled in the art may resort to modifications in the construction of the preferred embodiments shown herein, without departing from the scope, as defined in the appended claims, and the spirit of the invention. It is contemplated that the principles of the invention may be also applied to numerous diverse types of display devices, such as liquid crystal devices, plasma devices, luminescent devices, cathode ray tube devices, and the like.

CORRELATION TABLE

This is a correlation table of reference characters used in the drawings herein, their descriptions, and examples of comercially available parts.

| # | DESCRIPTION | EXAMPLE |
|---|---|---|
| 1 | multicolor LED | |
| 2 | red LED | |
| 3 | green LED | |
| 4 | blue LED | |
| 5 | resistor | |
| 6 | inverting buffer | 74LS240 |
| 7 | non-inverting buffer | 74LS244 |
| 8 | housing for LEDs | |
| 9 | light scattering material | |
| 11 | majority gate | |
| 13 | 3-input NAND gate | 74HC10 |
| 14 | 3-input OR gate | 74HC4075 |
| 15 | 3-input AND gate | 74HC11 |
| 16 | tri-state inverting buffer | 74LS240 |
| 17 | tri-state non-inverting buffer | 74HC126 |

What I claim is:

1. A method of simultaneously indicating, on a single multicolor optical output, a majority logical function and a Boolean logical function, the method comprising:
   developing a majority logical signal in accordance with said majority logical function;
   developing a Boolean logical signal in accordance with said Boolean logical function;
   illuminating said optical output in accordance with said majority logical signal;
   controlling color of said optical output, when said optical output is illuminated, in accordance with said Boolean logical signal.

2. The method of indicating as defined in claim 1 wherein:
said optical output is illuminated in red color when simultaneously said majority logical signal has a high level value and said Boolean logical signal has a low level value;
said optical output is illuminated in yellow color when said Boolean logical signal has a high level value.

3. A logic device comprising:
three logic inputs for receiving logical signals;
a multicolor light source;
means for developing a majority logical signal in accordance with a majority logical function of said inputs;
means for developing a Boolean logical signal in accordance with a Boolean logical function of said inputs;
means for illuminating said light source in accordance with said majority logical signal;
means for controlling color of said light source, when said light source is illuminated, in accordance with said Boolean logical signal.

4. The logic device as defined in claim 3 wherein:
said light source is illuminated in red color when simultaneously said majority logical signal has a high level value and said Boolean logical signal has a low level value;
said light source is illuminated in yellow color when said Boolean logical signal has a high level value.

5. The logic device as defined in claim 3 wherein:
said Boolean logical function is an AND logical function;
said Boolean logical signal is an AND logical signal;
said light source is illuminated in red color when simultaneously said majority logical signal has a high level value and said AND logical signal has a low level value;
said light source is illuminated in yellow color when said AND logical signal has a high level value.

6. The logic device as defined in claim 3 wherein:
said Boolean logical function is an OR logical function;
said Boolean logical signal is an OR logical signal;
said light source is illuminated in red color when simultaneously said majority logical signal has a low level value and said OR logical signal has a high level value;
said light source is illuminated in yellow color when said OR logical signal has a low level value.

7. A logic device comprising:
three logic inputs for receiving logical signals;
a multicolor light source;
a majority gate having three inputs respectively coupled to said three logic inputs and a majority output for developing an output majority logical signal;
a Boolean gate having three inputs respectively coupled to said three logic inputs and a Boolean output for developing an output Boolean logical signal;
means for coupling said light source to said majority output for illuminating said light source in accordance with said output majority logical signal;
means for coupling said light source to said Boolean output for controlling color of said light source, when said light source is illuminated, in accordance with said output Boolean logical signal.

8. The logic device as defined in claim 7 wherein:
said Boolean gate is an AND gate;
said output Boolean logical signal is an output AND logical signal;
said light source is illuminated in red color when simultaneously said output majority logical signal is a high level signal and said output AND logical signal is a low level signal;
said light source is illuminated in yellow color when said output AND logical signal is a high level signal.

9. A logic device comprising:
three logic inputs for receiving logical signals;
a multicolor light source;
means for developing a majority logical signal in accordance with a majority logical function of said logic inputs;
means for developing an AND logical signal in accordance with an AND logical function of said logic inputs;
means for illuminating said light source in a first color when simultaneously said majority logical signal has a high level value and said AND logical signal has a low level value;
means for illuminating said light source in a second color when said AND logical signal has a high level value.

10. The logic device as defined in claim 7 wherein:
said light source is illuminated in red color when simultaneously said majority logical signal has a high level value and said AND logical signal has a low level value;
said light source is illuminated in yellow color when said AND logical signal has a high level value.

11. A logic device comprising:
three logic inputs for receiving logical signals;
a multicolor light source;
means for developing a majority logical signal in accordance with a majority logical function of said logic inputs;
means for developing an OR logical signal in accordance with an OR logical function of said logic inputs;
means for illuminating said light source in a first color when simultaneously said majority logical signal has a low level value and said OR logical signal has a high level value;
means for illuminating said light source in a second color when said OR logical signal has a high level value.

12. The logic device as defined in claim 11 wherein:
said light source is illuminated in red color when simultaneously said majority logical signal has a low level value and said OR logical signal has a high level value;
said light source is illuminated in yellow color when said OR logical signal has a low level value.

13. A logic device comprising:
three logic inputs for receiving logical signals;
a multicolor light source;
an OR gate having three inputs respectively coupled to said three logic inputs and an output for developing an output OR logical signal;
a majority gate having three inputs respectively coupled to said three logic inputs and an output for developing an output majority logical signal;
an AND gate having three inputs respectively coupled to said three logic inputs and an output for developing an output AND logical signal;

means for extinguishing said light source when said output OR logical signal has a low level value;

means for illuminating said light source in a first color when simultaneously said output OR logical signal has a high level value and said output majority logical signal has a low level value;

means for illuminating said light source in a second color when simultaneously said output majority logical signal ha a high level value and said output AND logical signal has a low level value;

means for illuminating said light source in a third color when said output AND logical signal has a high level value.

14. The logic device as defined in claim 13 wherein:

said light source is illuminated in blue color when simultaneously said output OR logical signal has a high level value and said output majority logical signal has a low level value;

said light source is illuminated in green color when simultaneously said output majority logical signal has a high level value and said output AND logical signal has a low level value;

said light source is illuminated in red color when said output AND logical signal has a high level value.

* * * * *